United States Patent
Choi et al.

(10) Patent No.: US 8,222,089 B2
(45) Date of Patent: Jul. 17, 2012

(54) TAPE FOR HEAT DISSIPATING MEMBER, CHIP ON FILM TYPE SEMICONDUCTOR PACKAGE INCLUDING HEAT DISSIPATING MEMBER, AND ELECTRONIC APPARATUS INCLUDING THE SAME

(75) Inventors: Kyoung-sei Choi, Yongin-si (KR); Byung-seo Kim, Suwon-si (KR); Young-jae Joo, Yongin-si (KR); Ye-chung Chung, Hwaseong-si (KR); Kyong-soon Cho, Goyang-si (KR); Sang-heui Lee, Cheonan-si (KR); Si-hoon Lee, Suwon-si (KR); Sa-yoon Kang, Seoul (KR); Dae-woo Son, Cheonan-si (KR); Sang-gui Jo, Seoul (KR); Jeong-kyu Ha, Yongin-si (KR); Young-sang Cho, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/033,307

(22) Filed: Feb. 23, 2011

(65) Prior Publication Data

US 2011/0143625 A1    Jun. 16, 2011

Related U.S. Application Data

(63) Continuation of application No. 12/385,731, filed on Apr. 17, 2009, now Pat. No. 7,915,727, which is a continuation-in-part of application No. 11/878,016, filed on Jul. 20, 2007.

(30) Foreign Application Priority Data

Apr. 17, 2008  (KR) .................. 10-2008-0035821
Sep. 8, 2008   (KR) .................. 10-2008-0088469
Sep. 29, 2008  (KR) .................. 10-2008-0095518

(51) Int. Cl.
*H01J 9/00* (2006.01)
(52) U.S. Cl. .................. 438/123; 438/125; 257/E23.005
(58) Field of Classification Search .................. 438/122, 438/125; 445/24; 257/E23.01, E23.005
See application file for complete search history.

(56) References Cited

U.S. PATENT DOCUMENTS 5,907,903 A    6/1999   Ameen et al.
(Continued)

FOREIGN PATENT DOCUMENTS

| CN | 1219768 | 6/1999 |
| JP | 09-066620 | 3/1997 |
| JP | 11-176887 | 7/1999 |

(Continued)

OTHER PUBLICATIONS

Office Action from Chinese Patent Office for Application No. 200910130468.1 dated Mar. 1, 2012.

*Primary Examiner* — Roy Potter
(74) *Attorney, Agent, or Firm* — Muir Patent Consulting, PLLC

(57) ABSTRACT

Disclosed is a chip-on-film (COF) type semiconductor package and a device using the same. The COF type semiconductor package may include an insulation substrate including a top surface and bottom surface, a semiconductor device on the top surface of the insulation substrate, a heat dissipating component on the bottom surface of the insulation substrate, and at least one space between the bottom surface of the insulation substrate and a top surface of the heat dissipating component.

12 Claims, 9 Drawing Sheets

U.S. PATENT DOCUMENTS

| | | | |
|---|---|---|---|
| 6,134,776 | A | 10/2000 | Hoffmeyer |
| 6,300,168 | B1 | 10/2001 | Takeuchi |
| 6,765,254 | B1 * | 7/2004 | Hui et al. .................... 257/296 |
| 6,774,432 | B1 * | 8/2004 | Ngo et al. .................... 257/325 |
| 6,861,750 | B2 | 3/2005 | Zhao et al. |
| 6,894,904 | B2 | 5/2005 | Kung et al. |
| 7,259,448 | B2 | 8/2007 | Zhang et al. |
| 2008/0258290 | A1 | 10/2008 | Nakajima |

FOREIGN PATENT DOCUMENTS

| | | |
|---|---|---|
| JP | 2005-108387 | 4/2005 |
| JP | 2006-064939 | 3/2006 |
| JP | 2007-019203 | 1/2007 |
| KR | 10-2004-0004942 A | 1/2004 |
| KR | 10-2007-0056499 A | 6/2007 |
| KR | 10-0785950 B1 | 12/2007 |
| KR | 10-2008-0011802 A | 2/2008 |

* cited by examiner

TAPE FOR HEAT DISSIPATING MEMBER, CHIP ON FILM TYPE SEMICONDUCTOR PACKAGE INCLUDING HEAT DISSIPATING MEMBER, AND ELECTRONIC APPARATUS INCLUDING THE SAME

CROSS-REFERENCE TO RELATED APPLICATIONS

This application is a Continuation Application of and claims the benefit of priority under 35 U.S.C. §120 to U.S. patent application Ser. No. 12/385,731 filed on Apr. 17, 2009, and now issued as U.S. Pat. No. 7,915,727, which is a Continuation-In-Part Application and claims the benefit of U.S. patent application Ser. No. 11/878,016 under 35 U.S.C. §120, filed on Jul. 20, 2007, in the U.S. Patent and Trademark Office, and claims priority under 35 U.S.C. §119 to Korean Patent Application No. 10-2008-0095518, filed on Sep. 29, 2008, Korean Patent Application No. 10-2008-0035821, filed on Apr. 17, 2008, and Korean Patent Application No. 10-2008-0088469, filed on Sep. 8, 2008, in the Korean Intellectual Property Office (KIPO), the entire contents of which are herein incorporated by reference.

BACKGROUND

1. Field

Example embodiments relate to a chip-on-film (COF) type semiconductor package with improved heat dissipating efficiency. Example embodiments also relate to a display device using the COF type semiconductor package.

2. Description of the Related Art

A liquid crystal display (LCD) may be used as a display panel for various electronic devices. To further expand the LCD market, lower prices, larger display screens, and higher efficiencies may be required. Additionally, more pixels in a smaller region may be necessary. Recently, various packaging methods have been developed in the LCD field. Examples of such packaging methods include a tape carrier package (TCP) method, a chip on glass (COG) method, and a chip on film (COF) method. The TCP method was first introduced in the late 1980s for mass production of high resolution monitors. However, the COF method has increased its share of the market from the late 1990s due to cost reduction and yield improvement.

The COF method is a relatively new packaging method corresponding to a trend of using driver integrated circuits (ICs) in LCD apparatuses. However, heat generated by ICs may be a relatively serious problem. To resolve the heat generation problem, a method of forming a heat dissipating panel on a bottom surface of an insulation substrate to dissipate heat generated by a semiconductor device formed on a top surface of the insulation substrate is disclosed in the related art.

As an example of a COF type semiconductor package application, a COF semiconductor package may be attached to an edge surface of a substrate in an electronic apparatus, for example, an LCD panel, by using an adhesive bent toward a side of the substrate. The COF semiconductor package may also be pressed and fixed by a chassis of the electronic apparatus.

In the conventional art in which a COF type semiconductor package is pressed and fixed by a chassis of an electronic apparatus, the chassis may receive an external force from various directions. For example, an upward, downward, leftward, and/or rightward force may be applied to the chassis of an electronic apparatus when the electronic apparatus is used for an extended period of time. As a result, a heat dissipating panel may be separated from an insulation substrate at a location in which the chassis and the heat dissipating panel contact each other. Such a separation may cut heat dissipation efficiency in half by interrupting a path of heat dissipation in which heat generated by a semiconductor device is dissipated through an insulation substrate, the heat dissipating panel, and the chassis. Furthermore, a COF type semiconductor package may also be separated from the electronic apparatus.

SUMMARY

Example embodiments provide a chip-on-film (COF) type semiconductor package. Example embodiments also provide for a display device using the chip-on-film (COF) type semiconductor package.

In accordance with example embodiments, a COF type semiconductor package may include an insulation substrate including a top surface and bottom surface, a semiconductor device on the top surface of the insulation substrate, a heat dissipating component on the bottom surface of the insulation substrate, and at least one space between the bottom surface of the insulation substrate and a top surface of the heat dissipating component.

In accordance with example embodiments, a display device may include a COF type semiconductor package that may include an insulation substrate including a top surface and bottom surface, a semiconductor device on the top surface of the insulation substrate, a heat dissipating component on the bottom surface of the insulation substrate, and at least one space between the bottom surface of the insulation substrate and a top surface of the heat dissipating component.

BRIEF DESCRIPTION OF THE DRAWINGS

Example embodiments will be more clearly understood from the following detailed description taken in conjunction with the accompanying drawings. FIGS. 1A-13 represent non-limiting, example embodiments as described herein.

FIG. 1A is a cross-sectional view of a chip-on-film (COF) type semiconductor device having a heat dissipating component according to example embodiments;

FIG. 3 is a cross-sectional view of a COF type semiconductor package having a heat dissipating component according to example embodiments;

FIG. 4 is a cross-sectional view of a COF type semiconductor package having a heat dissipating component according to example embodiments;

FIG. 5 is a cross-sectional view of a COF type semiconductor package having a heat dissipating component according to example embodiments;

FIG. 6 is a cross-sectional view of a COF type semiconductor package having a heat dissipating component according to example embodiments;

FIGS. 7A through 9B are perspective views showing various shapes of an adhesive component according to example embodiments;

FIG. 10 is a concept view showing an example of applying a COF type semiconductor package, according to example embodiments, to an electronic apparatus;

FIG. 12 is a cross-sectional view of a tape package according to example embodiments; and FIG. 13 is a cross-sectional view partially showing a tape package, according to example embodiments, adhered to a side surface of a chassis of a display apparatus.

DETAILED DESCRIPTION

Figure 1A:
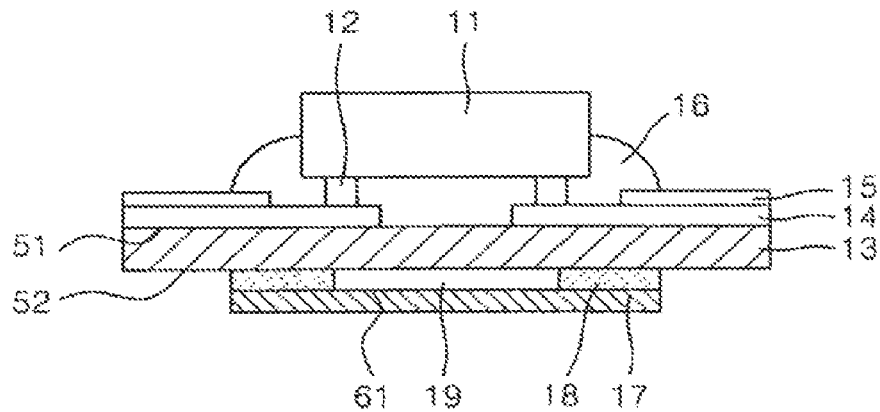

Example embodiments will now be described more fully with reference to the accompanying drawings, in which example embodiments are shown. Example embodiments may, however, be embodied in different forms and should not be construed as limited to the example embodiments set forth herein. Rather, example embodiments are provided so that this disclosure will be thorough and complete, and will fully convey the scope of the example embodiments to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1B:
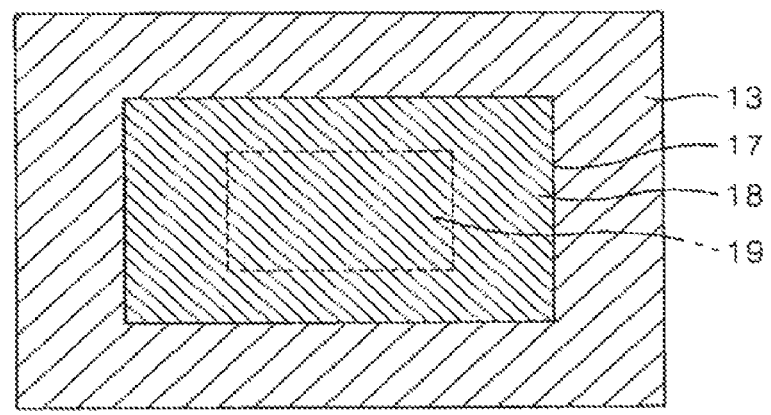
FIG. 1B is a bottom view of the COF type semiconductor device of FIG. 1.

FIG. 1A is a cross-sectional view of a chip-on-film (COF) type semiconductor device having a heat dissipating component 17 according to example embodiments. More specifically, FIG. 1 represents a COF type semiconductor package. FIG. 1B is a bottom view of the COF type semiconductor device of FIG. 1.

Referring to FIGS. 1A and 1B, the COF type semiconductor package according to example embodiments may include an insulation substrate 13 having a top surface 51 and a bottom surface 52. As shown in FIG. 1A, a semiconductor device 11 may be mounted on the top surface 51 of the insulation substrate 13 and a heat dissipating component 17 may be mounted on the bottom surface 52 of the insulation substrate 13. In accordance with example embodiments, the insulation substrate 13 may be in the form of a flexible film, for example, a polyimide and/or polyester film, and the semiconductor device 11 may include an integrated circuit. A plurality of conductive leads 14 may be formed on the insulation substrate 13 and may be formed to have a regular pattern. The plurality of conductive leads 14 may be formed of a conductive material, for example, copper. A surface insulation layer 15 may be formed on the leads 14, and the surface insulation layer 15 may be formed of a solder resist (SR) layer. When viewed from above, the plurality of leads 14 may be disposed on the insulation substrate 13 such that the leads 14 are separated and apart from each other. Additionally, the inner ends of the leads 14 may be centralized. The surface insulation layer 15 may be formed to partially expose the inner ends of the leads 14 and partially cover the leads 14.

The semiconductor device 11 may be disposed on exposed portions of the top surfaces of the leads 14 by interposing bumps 12 disposed therebetween, and a sealant 16 may be formed around the semiconductor device 11 to stably fix the semiconductor device 11 onto the insulation substrate 13.

The semiconductor device 11 may be a transistor, a diode, a light emitting diode (LED), a photodiode, or an active device. For example, the semiconductor device may be a junction transistor or a field effect transistor. As another example, the semiconductor device 11 may be a rectifier diode. As yet another example, the semiconductor device 11 may be a memory device or an integrated circuit. Furthermore, the semiconductor device 11 may also be a passive device, e.g., a capacitor, a resistor, or a coil.

The bumps 12 and the leads 14 may be electrically connected by using an alloy junction, e.g., Au—Sn or Au—Au. The sealant 16 may be formed of a molding resin.

The heat dissipating component 17 may be attached to the bottom surface 52 of the insulation substrate 13 by using an adhesive component 18. The heat dissipating component 17 may transmit heat generated by operations of the semiconductor device 11. For example, the heat dissipating component 17 may dissipate heat flowing downward through the sealant 16, the leads 14, and the insulation substrate 13 to effectively dissipate the heat outward. In accordance with example embodiments, the heat dissipating component 17 may be formed of various materials whose conductivities are greater than that of the insulation substrate 13. For example, the heat dissipating component 17 may be made from aluminum. In accordance with example embodiments, the adhesive component 18 may be made of an adhesive including the acryl-family.

A pressure absorbing zone 19 capable of absorbing externally applied pressure may be formed between the bottom surface 52 of the insulation substrate 13 and a top surface 61 of the heat dissipating component 17. The pressure absorbing zone 19 may be a space formed by removing a portion of the adhesive component 18. The space may be filled with either air or a pressure absorbing material capable of relieving externally applied pressure. For example, the pressure absorbing zone 19 may include a flexible film. In accordance with example embodiments, the pressure absorbing zone 19 may be a space sealed by the insulation substrate 13, the heat dissipating component 17, and the adhesive component 18. For effective heat dissipation and pressure absorption, the height of the pressure absorbing zone 19 may be between about 50 nm and about 300 nm. If the height of the pressure absorbing zone 19 is smaller than or equal to about 50 nm, or is greater than or equal to about 300 nm, an efficiency of heat dissipation may be degraded.

Figure 1C:
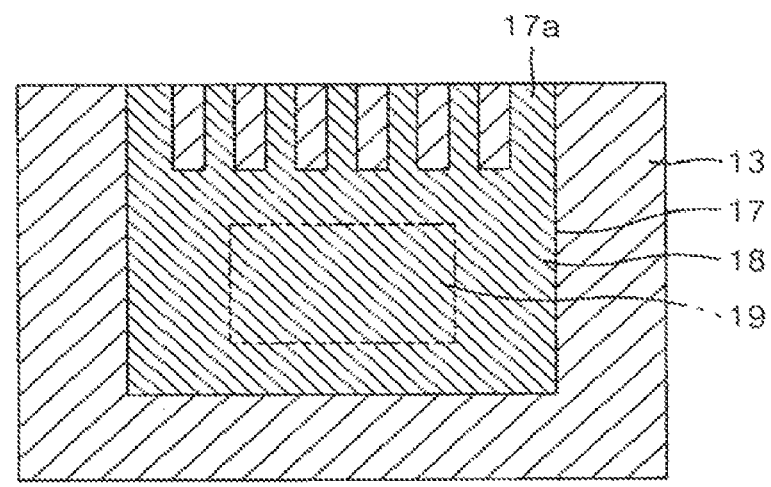
FIG. 1C is a bottom view of a COF type semiconductor package according to example embodiments.

FIG. 1C is a bottom view of a COF type semiconductor package according to example embodiments. The COF type semiconductor package of FIG. 1C may be identical to that of FIG. 1B except that the heat dissipating component 17 includes a protrusion 17a extending to an edge of the bottom surface 52 of the insulation substrate 13. The protrusion 17a may improve heat dissipation efficiency by being connected to an external heat dissipating device (not shown).

Figure 2A:
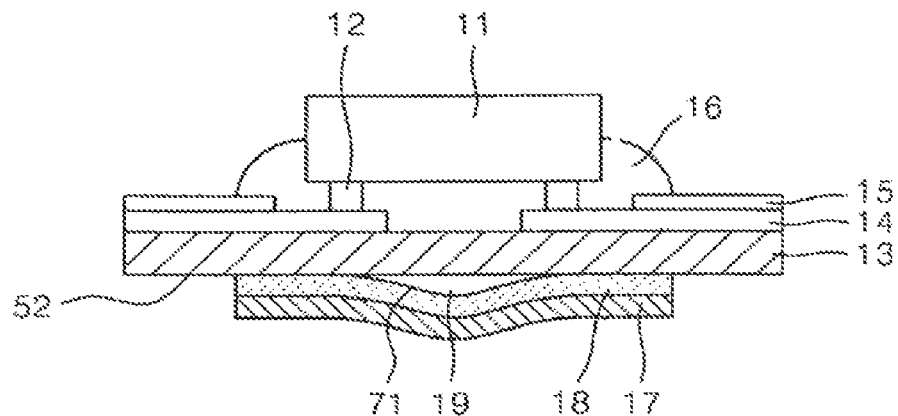
FIG. 2A is a cross-sectional view of a COF type semiconductor package including a heat dissipating component according to example embodiments.
Figure 2B:
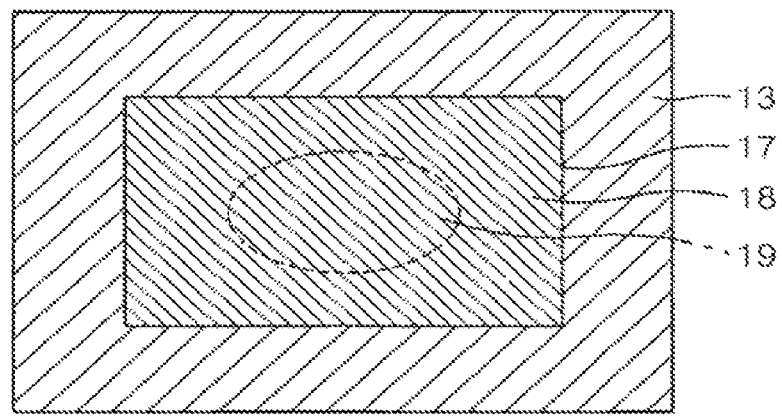
FIG. 2B is a bottom view of the COF type semiconductor package of FIG. 2A.

FIG. 2A is a cross-sectional view of a COF type semiconductor package including the heat dissipating component 17 according to example embodiments, and FIG. 2B is a bottom view of the COF type semiconductor package of FIG. 2A. In FIGS. 2A and 2B, the same components are referred by the same reference numerals, and detailed descriptions thereof will be omitted here.

Referring to FIGS. 2A and 2B, a space may exist between a bottom surface 52 of the insulation substrate 13 and a top surface 71 of the adhesive component 18. The space may constitute the pressure absorbing zone 19 capable of absorbing externally applied pressure. In example embodiments, the adhesive component 18 may have a constant thickness without removed portions.

More particularly, the pressure absorbing zone 19, according to example embodiments, may be a space formed as the adhesive component 18 may be physically separated from the bottom surface 52 of the insulation substrate 13. For relatively effective heat dissipation and pressure absorption, the height of the pressure absorbing zone 19 may be between about 50 nm and about 300 nm.

Figure 3:
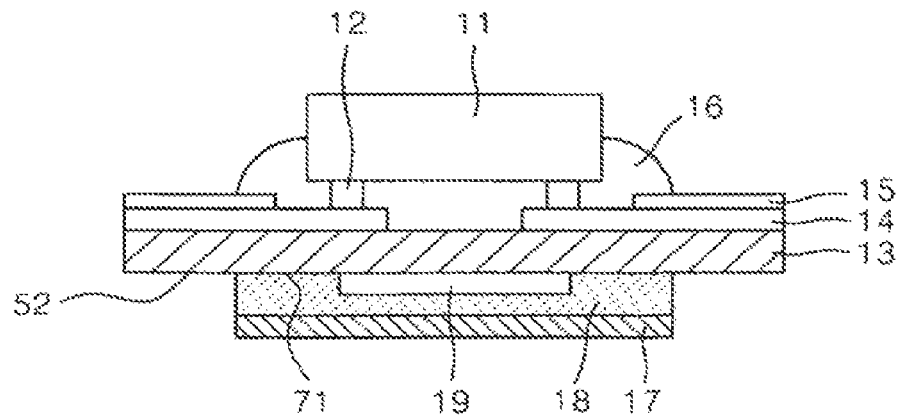

FIG. 3 is a cross-sectional view of a COF type semiconductor package having the heat dissipating component 17 according to example embodiments. Components that are the same as those in FIGS. 1A and 1B are referred to with the same reference numerals, and detailed descriptions thereof will be omitted here.

Referring to FIG. 3, a top surface 71 of the adhesive component 18 may contact the bottom surface 52 of the insulation substrate 13 and a portion of the top surface 71 of the adhesive component 18 may be partially removed to create a space between the bottom surface 52 of the insulation substrate 13 and the adhesive component 18. The space constitutes a pressure absorbing zone 19 that may be capable of absorbing externally applied pressure. As shown in FIG. 3, because a portion of the top surface 71 of the adhesive component 18 is removed, the profile of the adhesive portion may include a depressed stepped portion with the pressure absorbing zone 19 corresponding to the depressed stepped portion.

Figure 4:
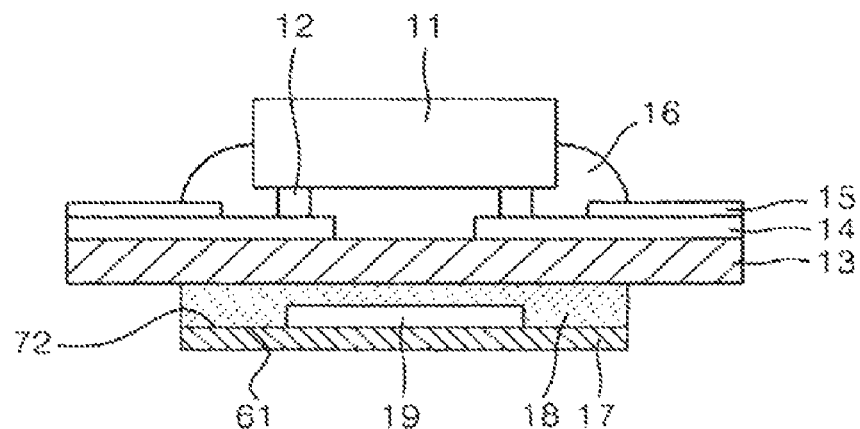

FIG. 4 is a cross-sectional view of a COF type semiconductor package having the heat dissipating component 17 according to example embodiments. Referring to FIG. 4, a bottom surface 72 of the adhesive component 18 may contact a top surface 61 of the heat dissipating component 17. As shown in FIG. 4, a portion of the adhesive component 18 may be removed to create a space between the bottom surface 72 of the adhesive component 18 and the heat dissipating component 17. The space constitutes a pressure absorbing zone 19 that may be capable of absorbing externally applied pressure. As shown in FIG. 4, because a portion of the bottom surface 72 of the adhesive component 18 is removed, the profile of the adhesive portion may include a depressed stepped portion with the pressure absorbing zone 19 corresponding to the depressed stepped portion.

Figure 5:
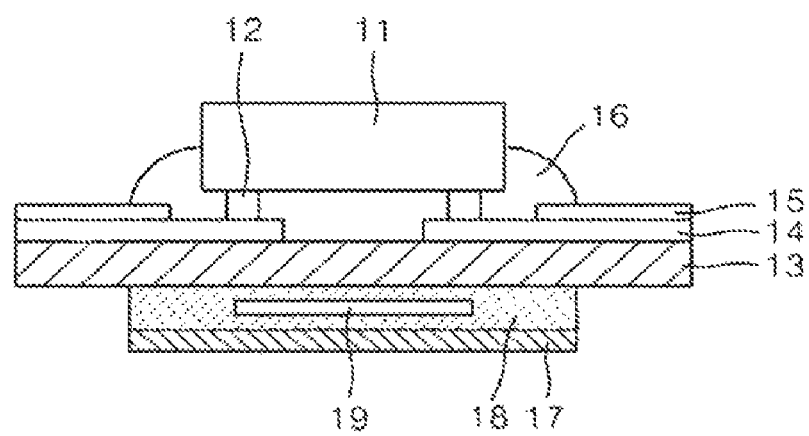

FIG. 5 is a cross-sectional view of a COF type semiconductor package having the heat dissipating component 17 according to example embodiments. A space may exist in the center of the adhesive component 18, and the space constitutes the pressure absorbing zone 19 that may be capable of absorbing externally applied pressure.

Figure 6:
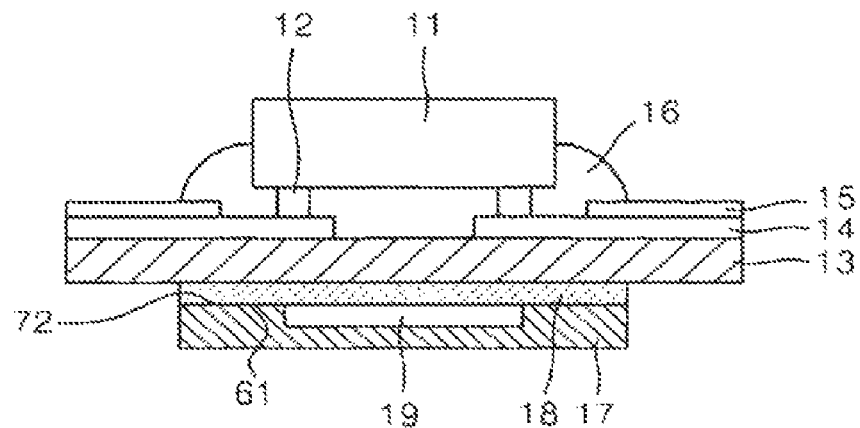

FIG. 6 is a cross-sectional view of a COF type semiconductor package having the heat dissipating component 17 according to example embodiments. As shown in FIG. 6, a top surface 61 of the heat dissipating component 17 may contact a bottom surface 72 of the adhesive component 18. In accordance with example embodiments, the top surface 61 of the heat dissipating component 17 may be partially removed to create a depressed stepped portion forming a space between the bottom surface 72 of the adhesive component 18 and the heat dissipating component 17. The space in the depressed stepped portion of the heat dissipating component constitutes the pressure absorbing zone 19 that may be capable of absorbing externally applied pressure. Although not shown, both a surface of the adhesive component 18 and a surface of the heat dissipating component 17 contacting each other may be partially removed to form a space for a pressure absorbing zone.

FIGS. 7A through 9B are perspective views showing various shapes of the adhesive component 18 according to example embodiments.

FIGS. 7A through 7F show examples in which the adhesive component 18 may be partially removed and/or penetrated. The examples of the adhesive component 18 illustrated in FIGS. 7A through 7F may correspond to the examples of the adhesive component 18 illustrated in FIG. 1A.

Figure 7A:
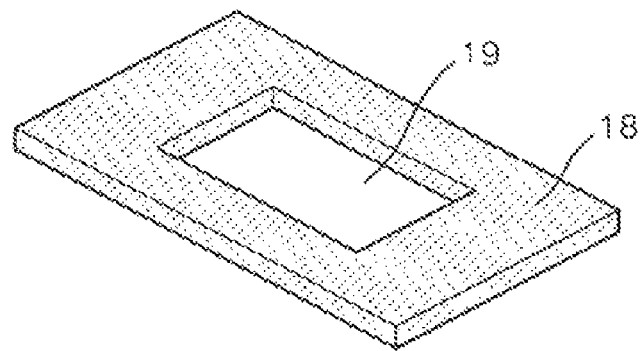

Referring to FIG. 7A, the center of the adhesive component 18 may be partially removed and penetrated. The space formed therein constitutes the pressure absorbing zone 19. The pressure absorbing zone may be sealed by the insulation substrate 13, the heat dissipating component 17, and the adhesive component 18 as illustrated in FIG. 1. Although the shape of the space from which a portion of the adhesive component 18 is removed is illustrated as a rectangle, example embodiments are not limited thereto, and the space may have various shapes, for example, circles, ellipses, and polygons.

Figure 7B:
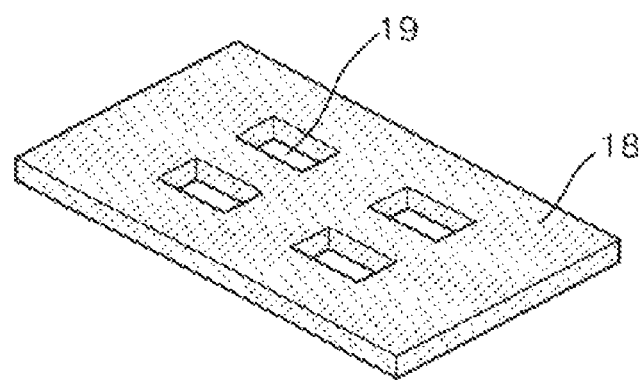

Referring to FIG. 7B, a plurality of penetrated pressure absorbing zones 19 may be formed in the adhesive component 18. The number of penetrated pressure absorbing zones 19 may vary, and their locations may be either regularly or irregularly arranged.

Figure 7C:
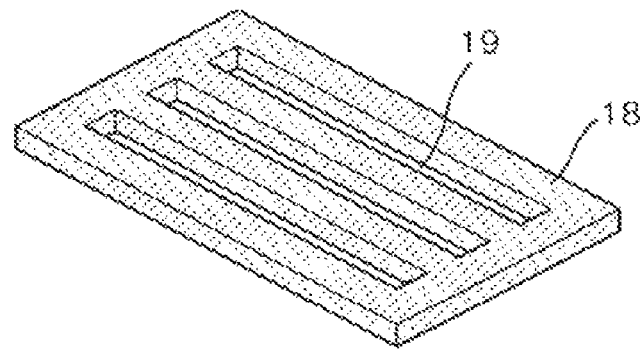

Referring to FIG. 7C, a plurality of closed penetrated pressure absorbing zones 19 may have a stripe shape and may be formed in the adhesive component 18.

Although FIGS. 7A-7C illustrate examples of a pressure absorbing zones 19 that are closed, example embodiments are not limited thereto. For example, referring to FIG. 7D, an embodiment in which a single unclosed pressure absorbing zone 19 may be formed in a single adhesive component 18.

Figure 7D:
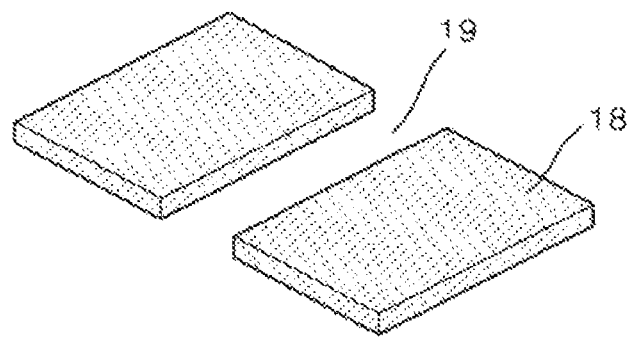
Figure 7E:
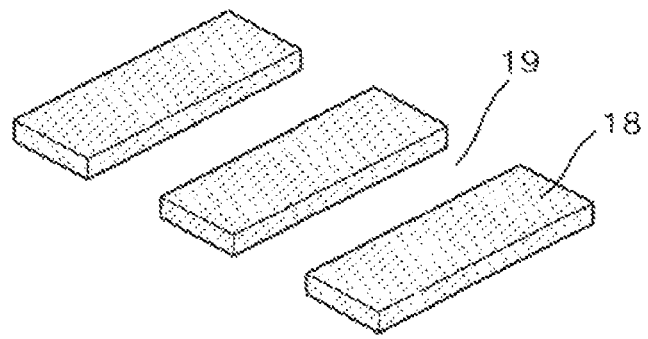

Referring to FIG. 7E, the pressure absorbing zones 19 may have a stripe shape similar to that illustrated in of FIG. 7C. However, the pressure absorbing zones 19 illustrated in FIG.

7E extend to separate the adhesive component 18 into a plurality of portions, and thus a plurality of penetrated pressure absorbing zones 19 may be formed. As shown in FIGS. 7D and 7E, the pressure absorbing zone 19 may be unsealed so that the pressure absorbing zone 19 is exposed to or connected to the outside.

Figure 7F:
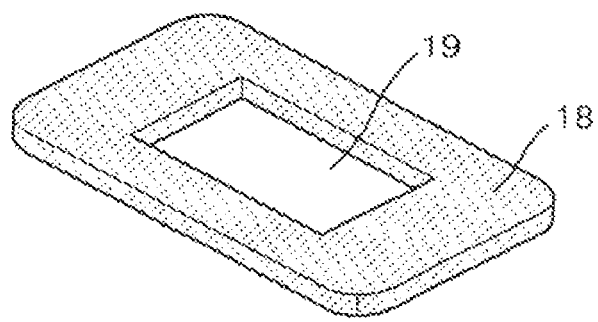

Referring to FIG. 7A, the corners of the adhesive component 18 may form right angles, however, corners having such a configuration may be vulnerable to stress. The stress may cause the adhesive component 18 to separate from an attached component. However, as shown in FIG. 7F, the corners may be rounded to reduce the chances of the separation of the adhesive component 18. In the alternative, the corners may be chamfered for relieving the stress applied thereto.

Figure 8A:
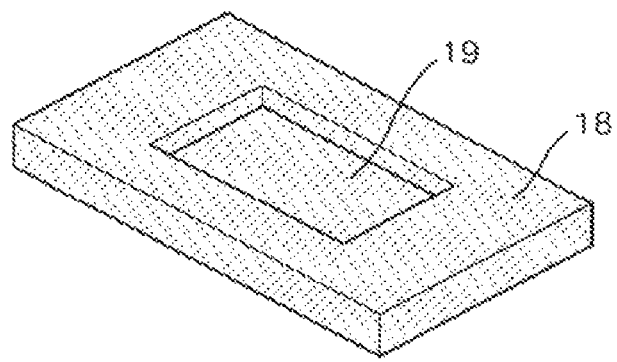
Figure 8B:
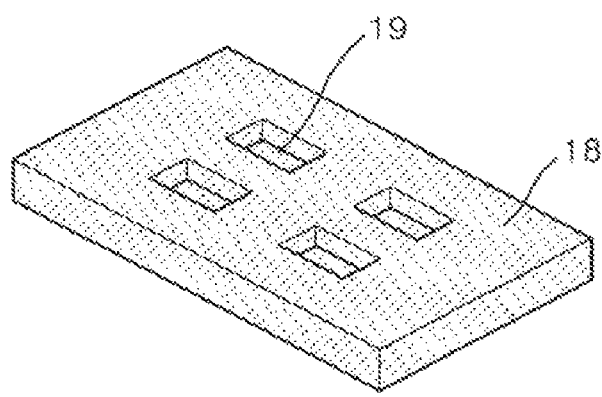
Figure 8C:
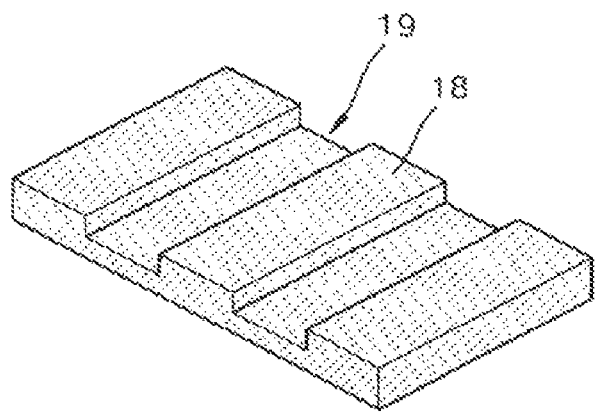

FIGS. 8A through 8C show examples in which the adhesive component 18 may be partially removed but not penetrated. The example adhesive components 18 illustrated in FIGS. 8A through 8C may correspond to the example adhesive components 18 illustrated in FIG. 3. Although the adhesive component 18 is not penetrated, shapes of the pressure absorbing zone 19 may vary in a manner that corresponds to FIGS. 7A through 7F.

Figure 9A:
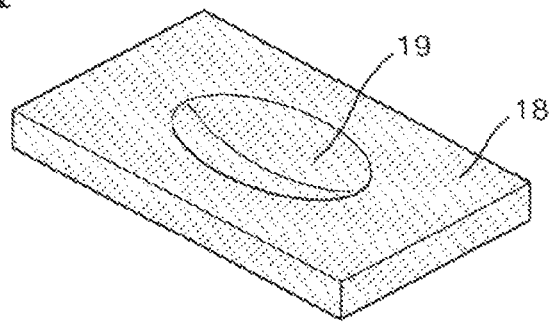
Figure 9B:
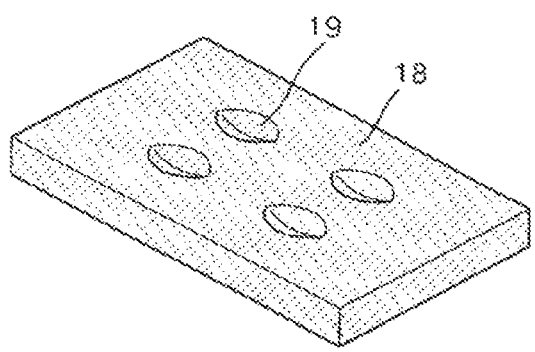

FIGS. 9A and 9B show examples in which the adhesive component 18 is not partially removed. To the contrary, the pressure absorbing zones 19 illustrated in FIGS. 9A and 9B are either convex or concave at predetermined or given locations. The adhesive component 18 in FIG. 9A may correspond to the adhesive component 18 illustrated in FIG. 2A. In FIG. 9A, a single pressure absorbing zone 19 is illustrated corresponding to a single adhesive component 18. In FIG. 9B, a plurality of pressure absorbing zones 19 are illustrated in a single adhesive component 18.

Figure 10:
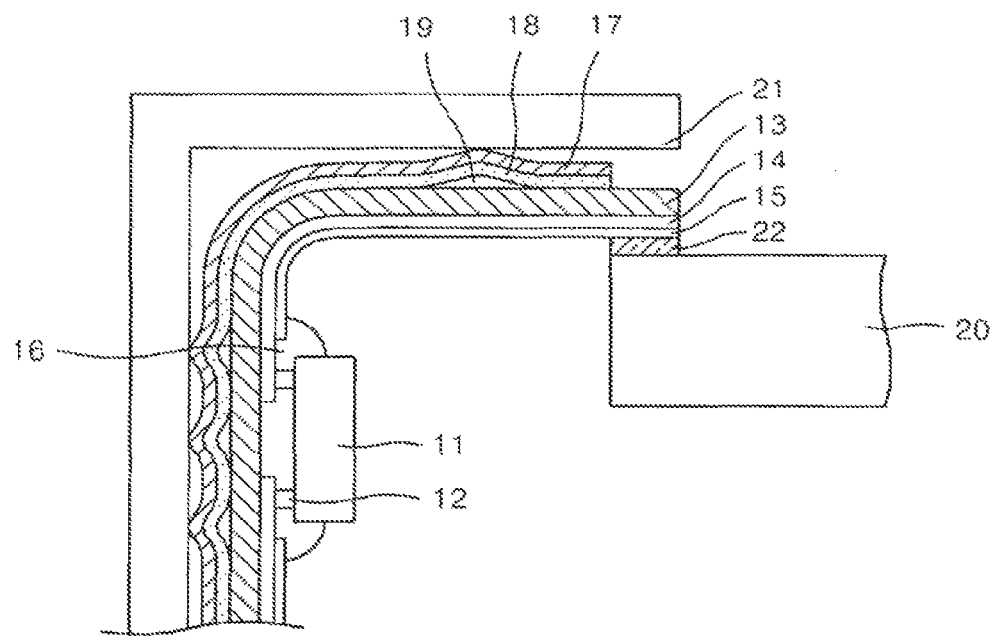

FIG. 10 is a concept view showing an example of applying a COF type semiconductor package to an electronic apparatus, for example, a liquid crystal display (LCD) panel.

Referring to FIG. 10, an end of a COF type semiconductor package of FIG. 2A, for example, may be attached to an edge of a top surface of a substrate 20 of an electronic apparatus by using an adhesive 22 and may be fixed by using a chassis 21.

Referring to FIG. 10, the COF type semiconductor package may be attached such that a portion of the surface insulation layer 15 contacts the substrate 20 of the electronic apparatus, and the chassis 21 contacts the heat dissipating component 17 and presses and fixes the same. As shown in FIG. 10, the pressure absorbing zones 19 may exist close to the heat dissipating component 17 contacting the chassis 21. Thus, even if the chassis 21 applies force or shock to the substrate 20 in various directions, for example, upward, downward, to the left, or to the right, the pressure absorbing zones 19 may relieve the force or the shock. Accordingly, the pressure absorbing zones may prevent or retard the heat dissipating component 17 from being separated from the insulation substrate 13.

Figure 11A:
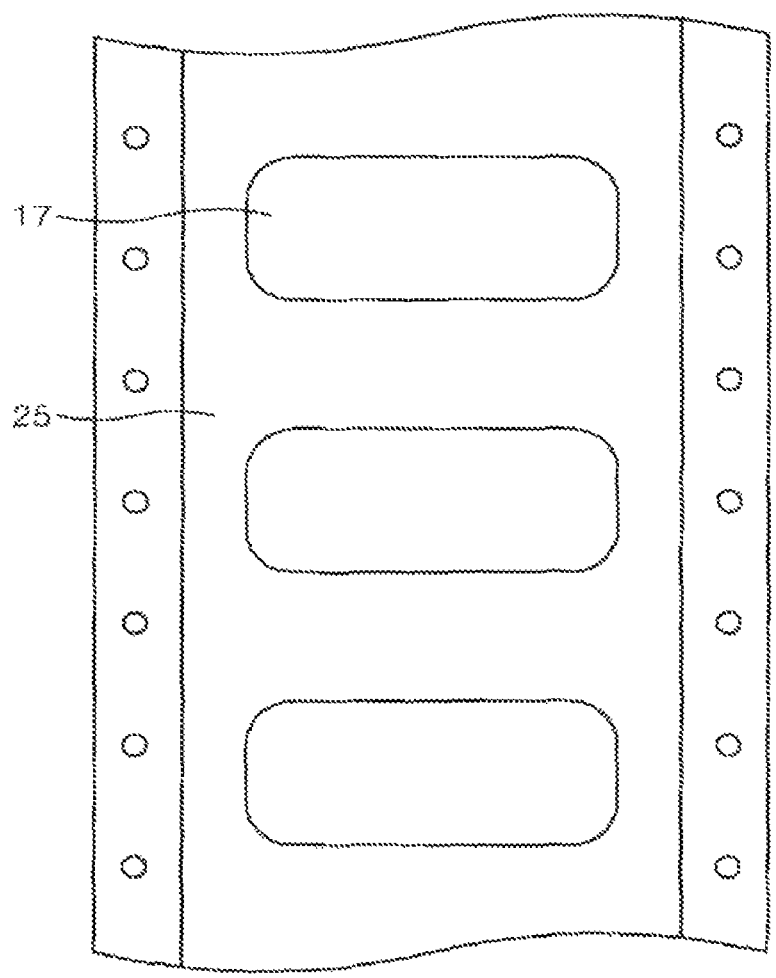
FIG. 11A is a diagram of a heat dissipating component tape according to example embodiments.
Figure 11B:
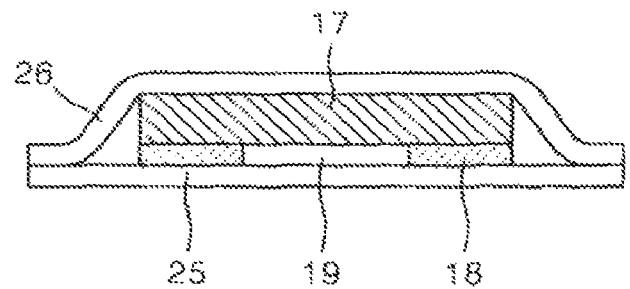
FIG. 11B is a cross-sectional view obtained by horizontally cutting the heat dissipating component tape of FIG. 11A.

FIG. 11A is a diagram of a heat dissipating component tape for transporting the heat dissipating component 17 according to example embodiments, and FIG. 11B is a cross-sectional view obtained by horizontally cutting the heat dissipating component tape of FIG. 11A.

Referring to FIGS. 11A and 11B, the heat dissipating component 17 may be attached to a carrier tape 25 via an adhesive component 18 interposed therebetween. In accordance with example embodiments, the carrier tape 25 may be a windable tape, for example, a polyimide tape. A protective tape 26, for example, a polyimide tape, may further be formed on the heat dissipating component 17. The adhesive component 18 may be associated with any one of the adhesive components illustrated in FIGS. 1A-9B.

In fabricating a COF type semiconductor package according to example embodiments, the carrier tape 25 may be a removable component. The protective tape 26 may or may not be removed.

To briefly describe a method of fabricating the COF type semiconductor package of FIG. 1A, a chip type semiconductor device 11 may be attached to a top surface 51 of the insulation substrate 13 via the interposing bumps 12 and the sealant 16. The insulation substrate 13 may include leads 14 with the surface insulation layer 15 superposed thereon. The leads 14 may be arranged on the insulation substrate 13 to have a predetermined or regular pattern and may be formed on the insulation substrate 13 before the semiconductor device 11 is attached to the substrate 13. The carrier tape 25 may be removed from the heat dissipating component tape of FIG. 11A, and the heat dissipating component 17 may be attached such that the exposed adhesive component 18 is attached to the bottom surface 52 of the insulation substrate 13. Accordingly, a semiconductor package according to example embodiments may be fabricated.

Figure 12:
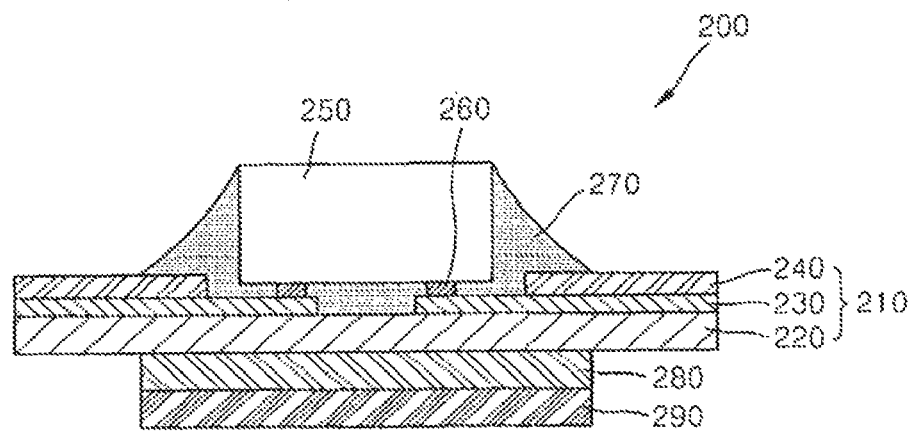

FIG. 12 is a cross-sectional view of a tape package 200 according to example embodiments. Referring to FIG. 12, the tape package 200 may be a COF type package. The tape package 200 may include a tape substrate 210 and a semiconductor chip 250. The tape substrate 210 may be a flexible printed circuit board (FBC).

The tape substrate 210 may include a base film 220, circuit patterns 230 disposed on a first surface of the base film 220, and a protective film 240 for protecting the circuit patterns 230. The base film 220 may be an insulating film, e.g., a polyimide or polyester film. The circuit patterns 230 may include a copper pattern. Furthermore, the circuit patterns 230 may include a copper pattern plated with tin, gold, or nickel. The protective film 240 may include a solder resist material. The protective film 240 may be disposed on the base film 220 and the circuit patterns 230 such that portions of the circuit patterns 230 are exposed.

The semiconductor chip 250 may include bumps 260 that are disposed on a surface of the semiconductor chip 250. The semiconductor chip 250 may be attached onto the tape substrate 210. The bumps 260 of the semiconductor chip 250 may contact the exposed portions of the circuit patterns 230 of the tape substrate 210. The circuit patterns 230 and the bumps 260 of the semiconductor chip 250 may be adhered to each other by using a tape automated bonding (TAB) technique. An underfill material 270 may fill up the space between the semiconductor chip 250 and the base film 220, and thus, the bumps 260 and the exposed portions of the circuit patterns 230 may be covered.

Furthermore, the tape package 200 may further include an adhesive layer 280, which may be disposed on a second surface of the base film 220 opposite to the surface on which the semiconductor chip 250 is disposed. The adhesive layer 280 may dissipate heat generated by the semiconductor chip 250.

The adhesive layer 280 may include a heat dissipating resin. For example, the adhesive layer 280 may include a resin that includes epoxy, acryl, or silicon, and may have a weight fraction from about 20% to about 80% with respect to the adhesive layer 280. For improved heat dissipation, the adhesive layer 280 may contain a heat conductive filler. Examples of the heat conductive filler includes alumina ($Al_2O_3$), boron nitride (BN), aluminum nitride (AlN), and/or diamond.

The adhesive layer 280 may include a hardening material. The adhesive layer 280 may include a resin which may be hardened by heat, a resin which may be hardened at room temperature, or a resin which may be hardened by ultraviolet rays. The adhesive layer 280 may be formed in a hardening process. For example, the hardening process may include applying the hardening material onto the second surface of the base film 220, and the hardening material may be from about 20% to about 40% hardened. The process may also include adhering the adhesive layer 280 of the tape package 200 to the chassis of a display apparatus during modularization, and the hardening material may be from about 90% to about 100% hardened. The volume of the adhesive layer 280 may change within the scope of about 0.1% of the volume prior to the hardening operation, and the adhesive layer 280 may have a heat conductivity from about 0.5 W/mK to about 10 W/mK. Furthermore, the adhesive layer 280 may have a glass transition temperature (Tg) from about 0° C. to about 200° C., and may have a coefficient of thermal expansion (CTE) from about 5 ppm/° C. to about 30 ppm/° C.

The tape package 200 may further include a film component 290 disposed on the second surface of the base film 220. The film component 290 may be disposed on the bottom surface of the adhesive layer 280. The film component 290 may contain a material having heterogeneity with respect to the base film 220, so that the film component 290 may be more easily separated from the adhesive layer 280 and the base film 220 when the tape substrate 210 is handled reel-to-reel.

Figure 13:
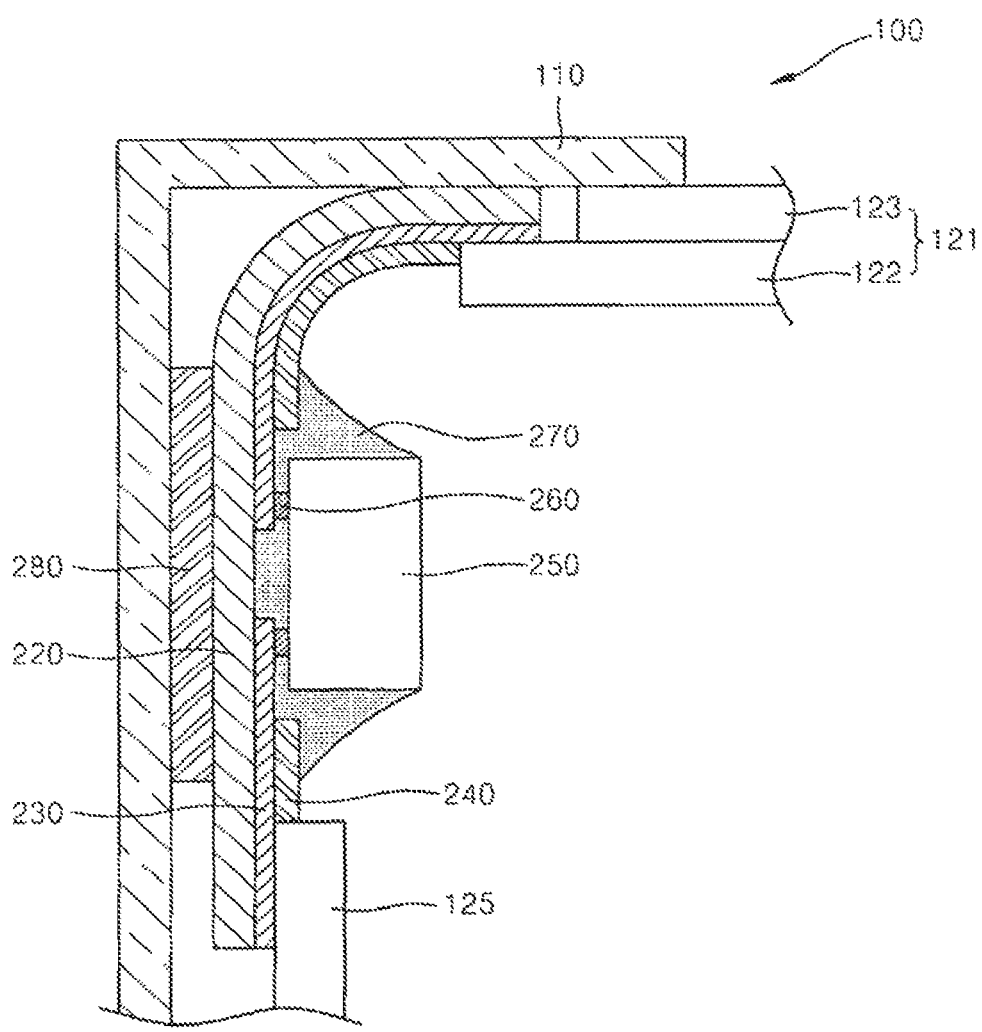

FIG. 13 is a cross-sectional view partially showing the tape package 200 adhered to a side surface of a chassis of a display apparatus 100. Referring to FIG. 13, the adhesive layer 280 of the tape package 200 may be adhered to the side surface of the chassis 110, and thus, the tape package 200 may be fixed to the chassis 110. Heat irradiated from the semiconductor chip 250 may be exhausted in a direction perpendicular to the top surface of the semiconductor chip 250 through the adhesive layer 280.

In the display device 100 shown in FIG. 13, reference numeral 121 refers to a display panel, and reference numeral 125 refers to a printed circuit board. The display panel 121 may include a lower substrate 122 and an upper substrate 123. A liquid crystal (not shown) may be disposed between the lower substrate 122 and the upper substrate 123.

While the inventive concept has been particularly shown and described with reference to example embodiments thereof, it will be understood that various changes in form and details may be made therein without departing from the spirit and scope of the following claims.

What is claimed is:

1. A method of fabricating a display apparatus comprising:
   attaching a semiconductor device onto a first surface of a base film;
   applying an adhesive material onto a second surface of the base film opposing the first surface;
   first hardening the adhesive material;
   attaching the first hardened adhesive material to a chassis of a display apparatus; and
   second hardening the attached adhesive material.

2. The method of claim 1, wherein the first hardening hardens the adhesive material to a hardness less than 50% of the maximum capable hardness for the adhesive material.

3. The method of claim 1, wherein the second hardening hardens the adhesive material to a hardness more than 90% of the maximum capable hardness for the adhesive material.

4. The method of claim 1, wherein the adhesive material comprises a resin, which can be hardened by heat or ultraviolet rays, and heat conductive filler.

5. The method of claim 4, wherein the resin comprises epoxy, acryl, or silicon.

6. The method of claim 4, wherein the resin has a weight fraction from about 20% to about 80% with respect to the weight of the adhesive material.

7. The method of claim 4, wherein the heat conductive filler comprises alumina ($Al_2O_3$), boron nitride (BN), aluminum nitride (AlN), and/or diamond.

8. The method of claim 1, wherein a volume of the adhesive material changes within substantially 0.1% of the volume prior to the hardenings.

9. The method of claim 1, further comprising:
   separating a portion of the adhesive material from a portion of the second surface of the base film to make a space.

10. The method of claim 9, wherein the height of the space is between 50 nm and 300 nm.

11. The method of claim 1, wherein the semiconductor device includes at least one semiconductor chip.

12. The method of claim 1, wherein the display apparatus comprises a liquid crystal display (LCD).

* * * * *